United States Patent [19]

Knothe et al.

[11] Patent Number: 4,811,293

[45] Date of Patent: Mar. 7, 1989

[54] METHOD FOR STORING DATA IN AN ELECTRICALLY ERASABLE MEMORY FOR CARRYING OUT THIS METHOD

[75] Inventors: Erich Knothe, Eddigehausen; Franz-Josef Melcher, Hardegsen, both of Fed. Rep. of Germany

[73] Assignee: Sartorius GmbH, Fed. Rep. of Germany

[21] Appl. No.: 852,726

[22] Filed: Apr. 15, 1986

[30] Foreign Application Priority Data

Apr. 20, 1985 [DE] Fed. Rep. of Germany ....... 3514430

[51] Int. Cl.⁴ ................................................. G11C 7/00
[52] U.S. Cl. ...................................... 365/189; 365/230
[58] Field of Search ............... 365/185, 189, 230, 233, 365/104

[56] References Cited

U.S. PATENT DOCUMENTS

| 3,742,458 | 6/1973 | Inoue et al. | 364/200 |
| 4,489,380 | 12/1984 | Carey et al. | 364/200 |
| 4,599,707 | 7/1986 | Fang | 365/189 X |
| 4,638,461 | 1/1987 | Yonezu et al. | 365/189 |
| 4,665,506 | 5/1987 | Cline et al. | 365/189 |

FOREIGN PATENT DOCUMENTS 2733531 2/1979 Fed. Rep. of Germany .

57-13468 1/1982 Japan .

Primary Examiner—Joseph A. Popek
Attorney, Agent, or Firm—Eric P. Schellin

[57] ABSTRACT

Method and apparatus of storing data in an electrically erasable memory connected to a microprocessor to effectively protect data stored in the memory from being unintentionally overwritten in cases of defective operation of the microprocessor, an overwrite protection system consisting of a write protect flip-flop (1) whose two logical states signify "with write protection" and "without write protction" and also a gate (3) in the write line which is controlled by the write protect flip-flop and in whose logical "with write protection" state, write errors are prevented from being conducted to the individual memory locations, and, finally a mechanical switch element (5) whereby these components are connected in such a manner that the write protect flip-flop (1) can only be brought into the one logical "with write protection" state by the microprocessor, while it can only be brought into the other logical "without write protection" state, if and when the mechanical switch element (5) is actuated. The overwrite protection can apply depending on the embodiment to the entire electronically erasable memory or only to the subareas thereof.

7 Claims, 4 Drawing Sheets

METHOD FOR STORING DATA IN AN ELECTRICALLY ERASABLE MEMORY FOR CARRYING OUT THIS METHOD

The invention is relative to a method of storing data in an electrically erasable memory connected to a microprocessor. The invention is also relative to an electrically erasable memory for carrying out this method. Electrically erasable memories of this type are generally known. Customary abbreviations are:

EEPROM = electrically erasable programmable read only memory

EAROM = electrically alterable read only memory, or

NVRAM = non-volatile random access memory.

In the following ; text the abbreviation EEPROM is always used for this electrically erasable memory.

There is the danger in memories of this type that the microprocessor will destroy important stored data by overwriting it unintentionally. Various circuits are known for protection against this happening; however, they all assume a smooth functioning of the microprocessor. If, on the other hand, the microprocessor is brought completely out of step by external electrical disturbance, for example, these circuits offer no absolute protection against data losses. The invention therefore has the task of indicating a method and a circuit which permit data to be inputted by the microprocessor during an initialization phase but prevent the stored data from being erased later in a reliable manner and under all conditions. The invention achieves this in a method for storing data in an electrically erasable memory connected to a microprocessor as follows: Any data desired can be inputted from the microprocessor into the electrically erasable memory during an initialization phase, the microprocessor defines at least a subarea of the electrically erasable memory as write-protected at the end of the initialization phase by setting at least one write protect flip-flop, the write protect flip-flop blocks the write line to the associated subarea of the electrically erasable memory in its logical state "with write protection" and the write protect flip-flop can only be brought into the logical stage "with write protection" by the microprocessor, while it can only be brought into the other logical state "without write protection" by the actuation of a mechanical switch element.

The electrically erasable memory for carrying out this method is characterized in that at least one write protect flip-flop is present whose two logical states signify "with write protection" and "without write protection", that at least one gate is present in the write line of the EEPROM memory which is controlled by the write protect flip-flop and prevents write errors from being conducted to the individual memory locations in its logical state "with write protection", that a mechanical switch element is present and that the write protect flip-flop can only be brought by the microprocessor into the one logical state "with write protection", while it can only be brought into the other logical state "without write protection" if the mechanical switch element is actuated.

Thus, in this method and in the associated circuit the microprocessor will bring the additional memory element into the logical state "with write protection" after the end of the initialization and the inputting of data into the EEPROM memory associated therewith, wherewith it prevents a further storing of data and the associated erasing of the old data. This write protection can only be cancelled by manually actuating the switch element, e.g. during an inspection or repair of the apparatus.

In order to prevent to the greatest extent possible an unintentional overwriting of data in this instance too, e.g. by a defective microprocessor, it is advantageous if the write protect flip-flop can only be brought into the logical state "without write protection" by the actuation of the mechanical switch element and, additionally, by the appropriate microprocessor command. This thus generally assumes a smooth functioning of the microprocessor for cancelling the write protection.

The write protection can apply to the entire EEPROM memory, which thus practically becomes a ROM memory; however, it can also be limited to one or more subareas while the other subareas remain as normal EEPROM memories for the microprocessor. Either a separate write protect flip-flop can be associated with each subarea to be protected thereby, or a main write protect flip-flop is used which controls subordinate subarea write protect flip-flops which then protect the individual subareas from overwriting.

The invention is explained below with reference made to the circuit diagrams.

Figure 1:
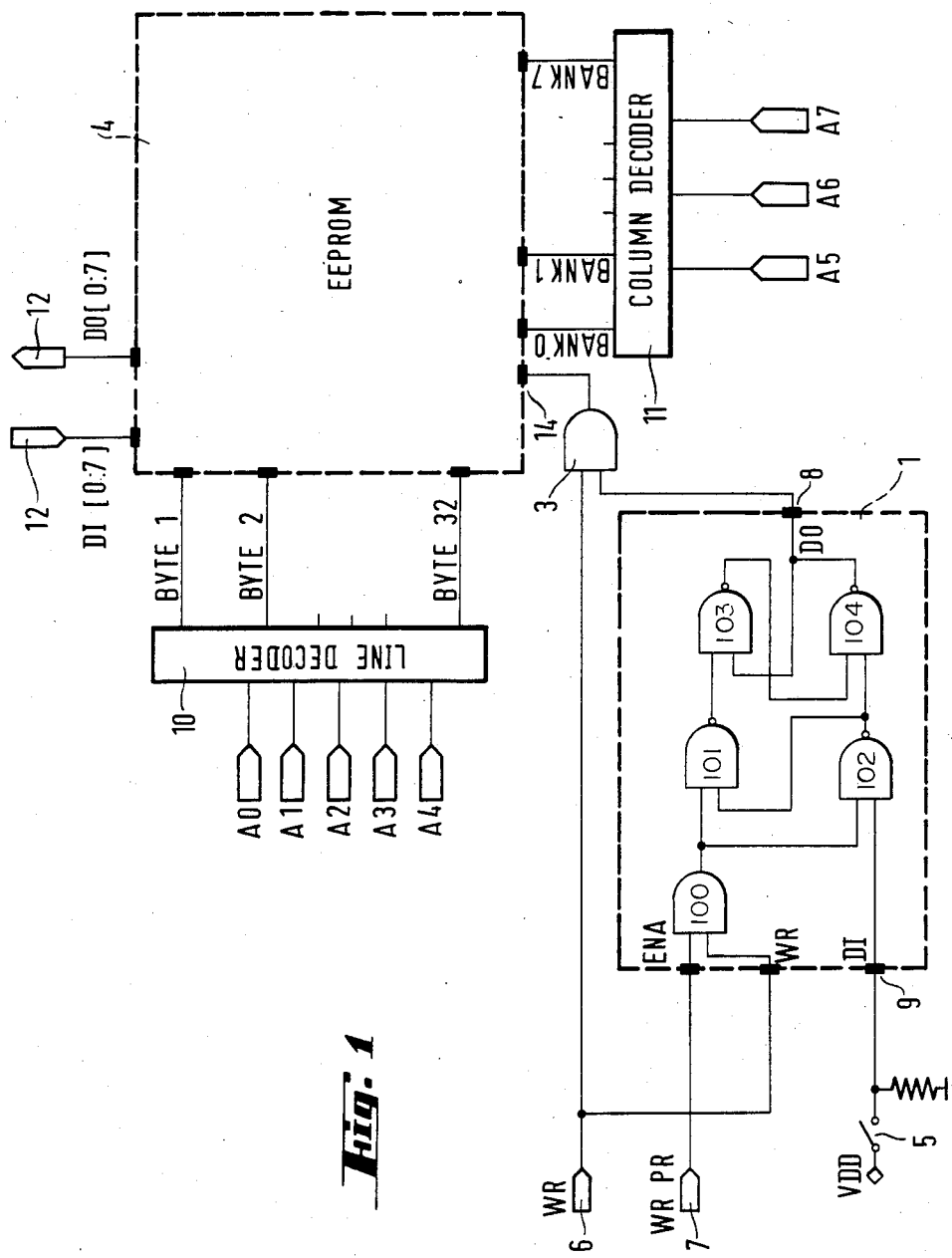
FIG. 1 shows a block diagram of an entirely protected EEPROM memory.

The block diagram of FIG. 1 shows EEPROM memory 4 with its customary control elements 10 for the line selection and 11 for column selection, its data in and outputs 12 and write input 14. Such EEPROM memories are generally known, for which reason their inner construction does not need to be explained in more detail here.

Gate 3 is built into the write line between supply line second input of gate 3 is on output 8 of write protect flip-flop 1. Write protect flip-flop 1 determines therewith whether write instructions are let through to the memory or not. If a logical "1" is on output 8 of write protect flip-flop 1, write instructions are let through; this is the logical gate "without write protection". In this state write protect flip-flop 1 is in the first initialization. However, the logical "0" is already permanently wired to data input 9 of write protect flip-flop 1 and can be retrieved by the microprocessor by a signal on write line 6 and write protect actuation line 7 into write protect flip-flop 1. This closes gate 3 and no more writing operations are possible in memory 4; this is thus the logical gate "with write protection". Write protect flip-flop 1, which is assumed to be a non-volatile memory element, can not be brought out of this state by the microprocessor, since the microprocessor has no access to data input 9. The microprocessor can only reestablish the original state "without write protection" by signals on both lines 6, 7 after mechanical switch element 5 has been closed, e.g. by a service technician. Depending on the requirement of the particular application, mechanical switch element 5 can be, for example, a mechanical feeler or a twin jack which can abee bridged by a short-circuit termination, or it can be soldering eyes or soldering pins which can be electrically connected by a metallic tool.

The circuit shown in FIG. 1 thus permits the microprocessor to write memory 4 with data in an initialization phase and to protect this data after the end of the initialization phase from a subsequent unintentional change. This protection is irreversible for the microprocessor and can only be cancelled by external mechanical actions as required.

Figure 2:
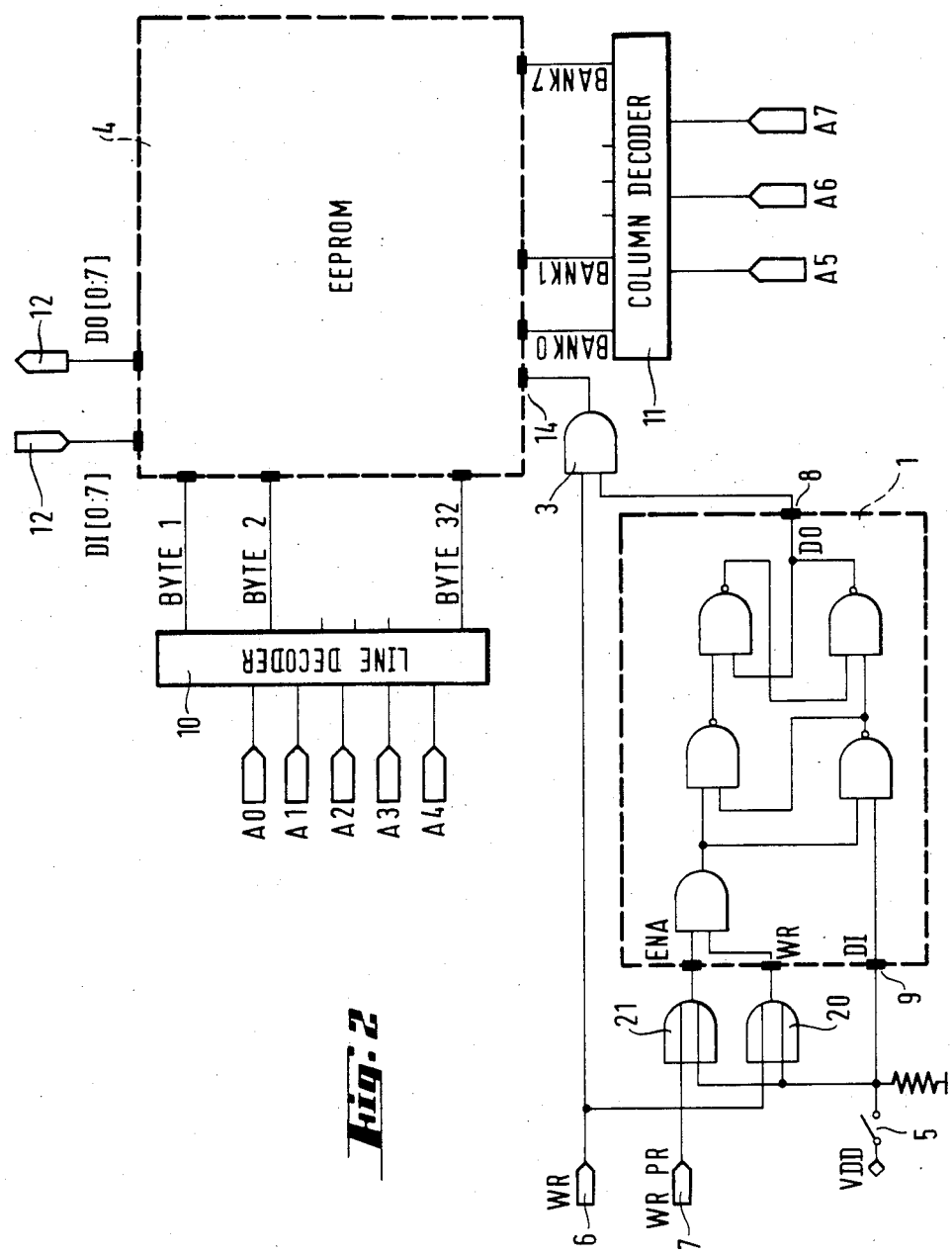
FIG. 2 shows a block diagram of an entirely protected EEPROM memory in another embodiment.

The embodiment of FIG. 2 differs from that of FIG. 1 only in the wiring of the inputs of write protect flip-flop 1. When mechanical switch element 5 is actuated, not only the logical "1" is put onto data input 9, but at the same time the write instruction (WR) and the enable command (ENA) are put onto write protect flip-flop 1 via two OR gates 20,21, so that write protect flip-flop 1 is brought without the cooperation of the microprocessor only by the actuation of mechanical switch element 5 into the logical state "without write protection".

Figure 3:
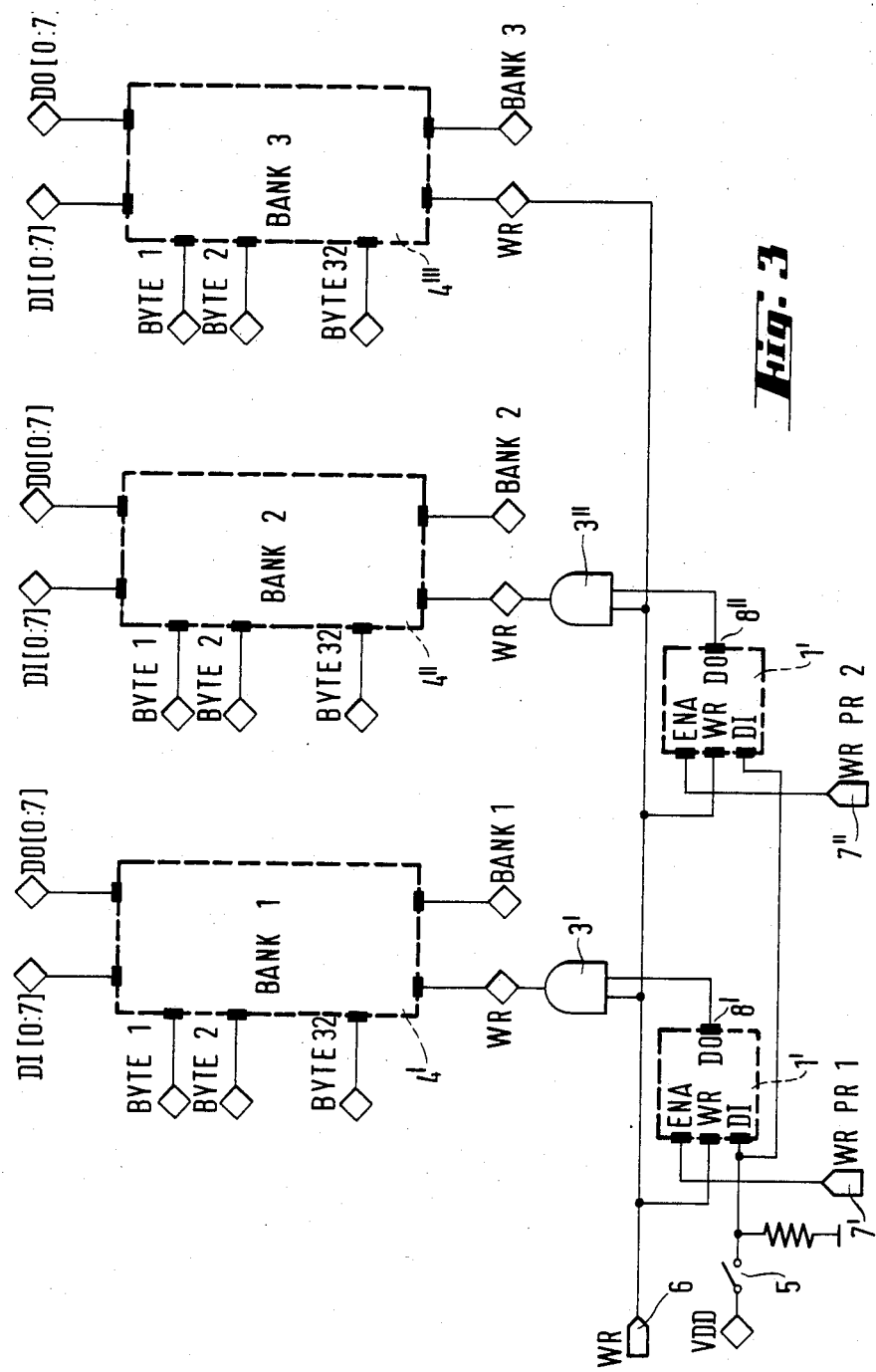
FIG. 3 shows a block diagram of a partially protected EEPROM memory in a first embodiment.

In FIGS. 1 and 2 the entire memory 4 was used with or without write protection. FIG. 3 shows how subareas can be provided with a write protection. Subarea 4''' of the memory is provided in advance as a normal, unprotected EEPROM memory. Area 4' can be protected by write protect flip-flop 1' connected to gate 3' and area 4'' can be protected by a second write protect flip-flop 1'' connected to gate 3''. Both write protect flip-flops 1' and 1'' are constructed like write protect flip-flop 1 in FIG. 1 and are therefore shown only schematically here. The two write protect actuation lines 7', 7'' run separately to the microprocessor in order to make possible a separate initiation of the write protection controlled by the program of the microprocessor. In this manner it is possible, for example, to provide different devices, which require different amounts of base data and general EEPROM data which does not have to be protected, with the same hardware. In the one device the command for the write protection is provided by the software at the end of the initialization for both write protect flip-flops 1', 1'', while in the other device the command for write protection is given by the software only for the one write protect flip-flop 1', so that memory area 4'' remains as a normal overwritable EEPROM memory. The unblocking of the write protection by means of mechanical switch element 5 occurs in FIG. 3 for both write protect flip-flops 1', 1'' together. Of course, a separate unblocking by two mechanical switch elements 5 is also possible if needed.

Figure 4:
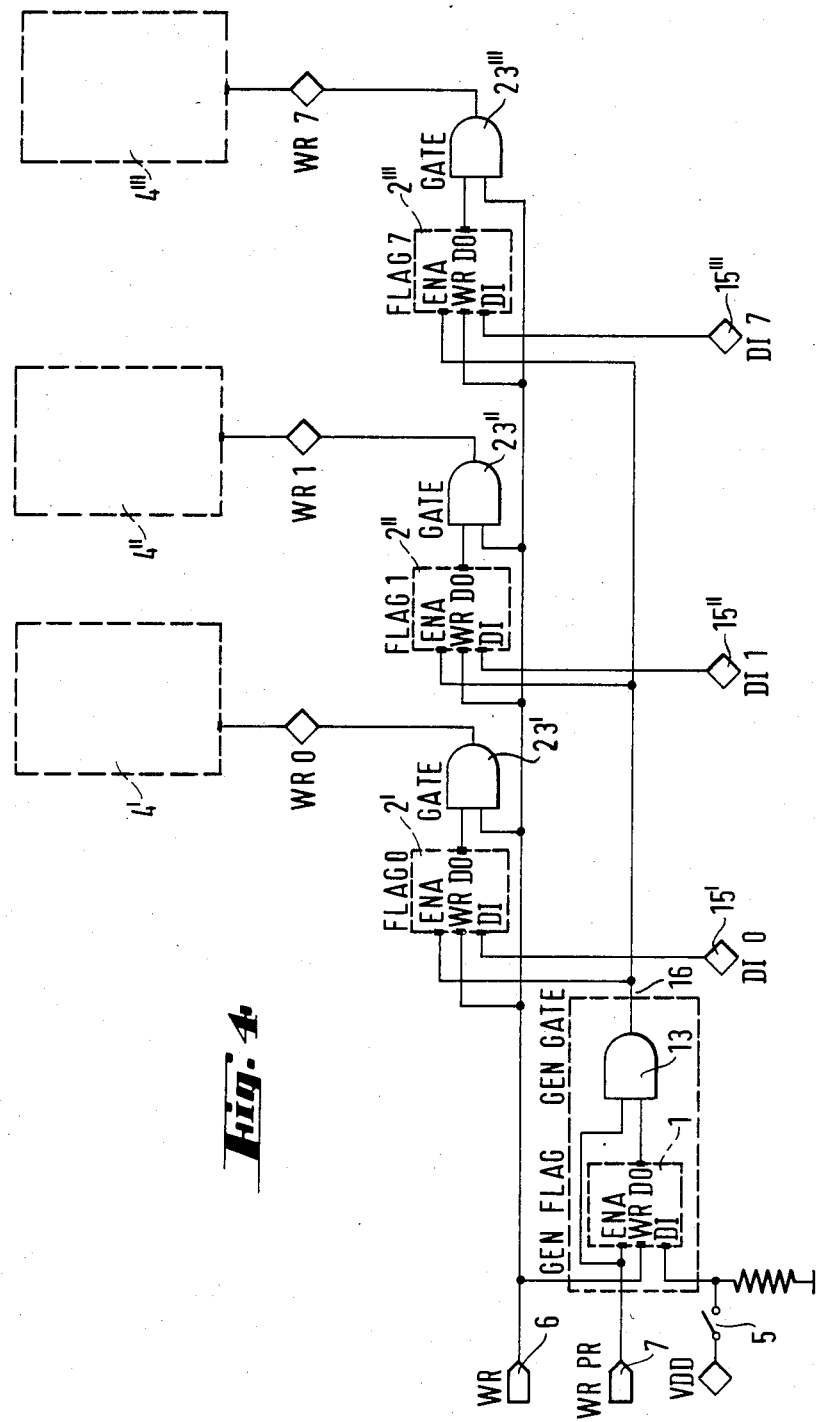
FIG. 4 shows a block diagram of a partially protected EEPROM memory in a second embodiment.

FIG. 4 shows another embodiment of the write protection for memory subareas. Here, a common main write protect flip-flop 1 is present for all memory subareas 4',4'',4'''; however, the control of gates 23',23'',23''' for blocking the write inpulses occurs under the interconnecting of subarea write protect flip-flops 2',2'',2'''. In the first initialization, main write protection flip-flop 1 and subarea write project flip-flops 2',2'',2''' are in logical state 1, so that gates 23',23'',23''' let write impulses through. After the end of the initialization, the microprocessor can determine at the same time as the write protection is being actuated which subareas should be write protected. If, for example, only second subarea 4'' is to be write protected, the microprocessor puts a logical "0" on its data input 15'' and a logical "1" on data inputs 15',15'' of other subareas 4',4'''. In this manner only the one subarea write protect flip-flop 2'' is brought into logical state "0" when the write signal reaches connection 6 and the write protect actuation signal reaches connection 7 from subarea write protect flip-flops 2',2'',2''', while the other subarea write protect flip-flops 2',2''' remain in logical state "1". At the same time, main write protect flip-flop 1 naturally receives the logical "0" permanently wired to its input, thus blocking gate 13, so that no more enable signals for subarea write protect flip-flops 2',2'',2''' can appear at its output 16. In this manner the microprocessor is no longer able to change the subdivision into write protected and non-write protected areas determined at the end of the initialization phase. The general cancelling of the write protection (by storing the logical "1" in the main write protect flip-flop 1) is also only possible, as in the other embodiments, after actuation of mechanical switch element 5.

We claim:

1. Method of storing data in an electrically erasable memory connected to a microprocessor, comprising the steps of inputing any data from the microprocessor into the electrically erasable memory during an initialization phase, defining at least a subarea of the electrically erasable memory as write-protected at the end of the initialization phase by setting at least one write protect flip-flop means, blocking a write line to the associated subarea of the electrically erasable memory in its logical "with write protection" state, and bringing the write protect flip-flop means into the logical "with write protect" state by the microprocessor, while it can only be brought into the other logical "without write protect" state by actuation of a mechanical switch means.

2. Method according to claim 1, characterized in that the write protect flip-flop means can be brought into the logical "without write protection" state only by actuating the mechanical switch means and, additionally, by a selected microprocessor command.

3. Method according to claim 1 or 2, characterized in that the electrically erasable memory is subdivided into several subareas and that a subarea write protect flip-flop means is associated with each of the several subareas.

4. Method according to claim 3, characterized in that a main write flip-flop overrides the subarea write protect flip-flop means and actuates the subarea write protect flip-flop means.

5. A electrically erasable memory which is connected to a microprocessor comprising at least one write-protect flip-flop means whose two respective logical states signify "with write protection" and "without write protection", at least one gate in a writing line of said electrically erasable memory being controlled by said write-protect flip-flop means and the at least one gate in response to logical "with write protection" state thereupon blocks passage of writing commands to individual storage cells of said memory, and a mechanical switching means being coupled at one input to said write-protect flip-flop means, such that said flip-flop means can only be brought by said microprocessor into the one logical state "with write protection", whereas said flip-flop means can only be brought into the other logical "without write protection" state when said mechanical switching means is actuated.

6. An electrically erasable memory in accordance with claim 5, including a separate, individual write-protect flip-flop means associated with an individual memory subarea of said electrically erasable memory.

7. An electrically erasable memory in accordance with claim 5, including a separate subarea write-protect flip-flop means associated with an individual memory subarea of the electrically erasable memory that controls all of the separate subarea write-protect flip-flop means by a single main write-protect flip-flop means.

* * * * *

UNITED STATES PATENT AND TRADEMARK OFFICE
CERTIFICATE OF CORRECTION

PATENT NO. : 4,811,293
DATED : March 7, 1989
INVENTOR(S) : Erich Knothe et al

It is certified that error appears in the above—identified patent and that said Letters Patent is hereby corrected as shown below:

Title page:

[75] Inventors:  Erich Knothe, Eddigehausen;
Franz-Josef Melcher, Hardegsen and
Christian Oldendorf, Gottingen all of
Fed. Rep. of Germany Signed and Sealed this Ninth Day of January, 1990

*Attest:*

JEFFREY M. SAMUELS

*Attesting Officer*     *Acting Commissioner of Patents and Trademarks*